US008357936B2

(12) United States Patent
Choi et al.

(10) Patent No.: US 8,357,936 B2
(45) Date of Patent: Jan. 22, 2013

(54) ARRAY SUBSTRATE FOR LIQUID CRYSTAL DISPLAY DEVICE AND METHOD OF FABRICATING THE SAME

(75) Inventors: Il-Man Choi, Daegu (KR); Ho-June Kim, Gyeongsangbuk-do (KR)

(73) Assignee: LG Display Co., Ltd., Seoul (KR)

( * ) Notice: Subject to any disclaimer, the term of this patent is extended or adjusted under 35 U.S.C. 154(b) by 325 days.

(21) Appl. No.: 11/894,919

(22) Filed: Aug. 22, 2007

(65) Prior Publication Data

US 2008/0099764 A1 May 1, 2008

(30) Foreign Application Priority Data

Oct. 25, 2006 (KR) .................. 10-2006-0103758

(51) Int. Cl.
*H01L 31/00* (2006.01)
(52) U.S. Cl. .. 257/59; 257/428; 257/E21; 257/E29.003; 438/155; 438/239; 349/98; 349/141; 349/129; 349/187
(58) Field of Classification Search .................. 257/428; 438/57
See application file for complete search history.

(56) References Cited

U.S. PATENT DOCUMENTS

| 6,737,653 | B2 * | 5/2004 | Choo et al. ............... 250/370.09 |
| 2003/0007107 | A1 * | 1/2003 | Chae et al. ...................... 349/43 |
| 2004/0109121 | A1 * | 6/2004 | Cho et al. ...................... 349/141 |
| 2006/0187397 | A1 * | 8/2006 | Nakamura et al. ............ 349/139 |
| 2006/0290826 | A1 * | 12/2006 | Paik et al. ........................ 349/38 |

FOREIGN PATENT DOCUMENTS

CN    1641453 A    1/2004

OTHER PUBLICATIONS

First Office Action issued in corresponding Chinese Patent Application No. 2007101438634; issued Oct. 24, 2008.

* cited by examiner

*Primary Examiner* — Evan Pert
*Assistant Examiner* — Mark A Laurenzi
(74) *Attorney, Agent, or Firm* — Brinks Hofer Gilson & Lione

(57) ABSTRACT

An array substrate for an LCD device includes a gate line crossing a data line to define a pixel region. A thin film transistor (TFT) includes a gate electrode connected to the gate line, insulating and active layers on the gate electrode, a source electrode connected to the data line, and a drain electrode spaced apart from the source electrode. An auxiliary common electrode includes a horizontal portion disposed in the pixel region. A metal layer overlaps the insulating layer and contacts the horizontal portion of the auxiliary common electrode through a contact hole defined through the insulating layer. A passivation layer is disposed on the TFT and the metal layer. A pixel electrode has a horizontal portion overlapping the metal layer with the passivation layer therebetween to form a storage capacitor, the pixel electrode connected to the drain electrode through a second contact hole defined through the passivation layer.

11 Claims, 8 Drawing Sheets

ARRAY SUBSTRATE FOR LIQUID CRYSTAL DISPLAY DEVICE AND METHOD OF FABRICATING THE SAME

RELATED APPLICATIONS

This application claims the benefit of priority under 35 U.S.C. §119 to Korean Patent Application No. 2006-0103758, filed on Oct. 25, 2006, which is hereby incorporated by reference in its entirety.

TECHNICAL FIELD

The present application relates to a liquid crystal display (LCD) device and a method of fabricating the LCD device, and more particularly, to an array substrate for an in-plane switching mode LCD device and a method of fabricating the array substrate.

BACKGROUND

Liquid crystal display (LCD) devices use the optical anisotropy and polarization properties of liquid crystal molecules to produce an image. The liquid crystal molecules have long, thin, shapes, and have an initial alignment direction including initial pretilt angles. The alignment direction can be controlled by applying an electric field to influence the alignment of the liquid crystal molecules. Due to an optical anisotropy property of liquid crystal, the refraction of incident light depends on the alignment direction of the liquid crystal molecules. Thus, by properly controlling the applied electric field, an image having a desired brightness can be produced.

Among the known types of liquid crystal displays (LCDs), active matrix LCDs (AM-LCDs), which have thin film transistors (TFTs) and pixel electrodes arranged in a matrix form, are the subject of significant research and development because of their high resolution and superior ability in displaying moving images.

LCD devices include two substrates spaced apart and facing each other, and a liquid crystal layer interposed between the two substrates. In one type of LCD device, each of the substrates includes an electrode with the electrodes of each substrate facing each other. A voltage is applied to each electrode inducing an electric field between the electrodes. The arrangement of the liquid crystal molecules is changed by varying the intensity of the electric field.

Because the electrodes are positioned respectively on each of the two opposing substrates, the electric field induced between the electrodes is perpendicular to the surfaces of the two substrates. Accordingly, LCD devices of this type have a narrow viewing angle because of the vertical electric field. In order to solve the problem of the narrow viewing angle, in-plane switching mode liquid crystal display (IPS-LCD) devices have been proposed. An IPS-LCD device includes a pixel electrode and a common electrode on the same substrate.

FIG. 1 is a cross-sectional view illustrating an IPS-LCD device according to the related art. In FIG. 1, an IPS-LCD device 5 includes a first substrate 10 and a second substrate 40 with a liquid crystal layer LC interposed therebetween. A pixel region P is defined on the first substrate 10. A thin film transistor (TFT) T is formed in the pixel region P on the first substrate 10 for use as a switching element. Common electrodes 18 and pixel electrodes 32 are also formed in the pixel region P. The TFT T includes a gate electrode 12, a semiconductor layer 22, a source electrode 24, and a drain electrode 26. A gate insulating layer 20 is formed between the gate electrode 12 and the semiconductor layer 22. The common electrodes 18 alternate with and are substantially parallel to the pixel electrodes 32 on the first substrate 10. The common electrodes 18 are formed of the same material and on the same layer as the gate electrode 12. A passivation layer 30 is formed on the TFT T and the pixel electrodes 32 are formed on the passivation layer 30. To increase aperture ratio and brightness, the pixel electrodes 32 may be formed of a transparent conductive material the same material and on the same layer as the source and drain electrodes 24 and 26.

The second substrate 40 is spaced apart from the first substrate 10. A black matrix 42 is formed on an inner surface of the second substrate 40 facing the first substrate 10. The black matrix 42 on the second substrate 40 corresponds to the TFT T, the gate line and the data line on the first substrate 10. A color filter layer 44 including three color filters of red 44a, green 44b, and blue (not shown) is formed on the black matrix 42. The color filter layer 44 corresponds to the pixel region P on the first substrate 10. The liquid crystal layer LC is interposed between the first substrate 10 and the second substrate 40. The alignment of the liquid crystal layer LC is controlled by a horizontal electric field induced between the common electrode 18 and the pixel electrode 32.

To improve aperture ratio and brightness further, an IPS-LCD device having common electrodes of a transparent conductive material has been suggested. FIG. 2 is a schematic plan view of an array substrate for an IPS-LCD device according to the related art and FIG. 3 is a schematic cross-sectional view taken along a line III-III of FIG. 2. As shown in FIGS. 2 and 3, a gate line 52 and a data line 68 are formed on a substrate 50. The gate line 52 and the data line 68 cross each other to define a pixel region P. A thin film transistor (TFT) T is connected to the gate line 52 and the data line 68. The TFT T includes a gate electrode 54, an active layer 60, a source electrode 64 and a drain electrode 66. A pixel electrode 72 and a common electrode 74 are formed of a transparent conductive material in the pixel region P. The pixel electrode 72 includes a horizontal portion 72a and vertical portions 72b extending from the horizontal portion 72a, and the common electrode 74 includes a horizontal portion 74a and vertical portions 74b extending from the horizontal portion 74a.

In addition, an auxiliary common electrode 56 having a rectangular ring shape is formed in the pixel region P. Accordingly, the auxiliary common electrode 56 includes first and second horizontal portions 56a and 56b and first and second vertical portions 56c and 56d constituting the rectangular ring shape. The common electrode 74 contacts the auxiliary common electrode 56, and the pixel electrode 72 contacts the drain electrode 66. As a result, a common voltage is applied to the common electrode 74 through the auxiliary common electrode 56 and a data signal is applied to the pixel electrode 72 through the drain electrode 66.

The first horizontal portion 56a of the auxiliary common electrode 56 overlaps the horizontal portion 72a of the pixel electrode 72 to constitute a storage capacitor Cst. Overlapped portions of the first horizontal portion 56a and the horizontal portion 72a function as first and second capacitor electrodes, respectively, of the storage capacitor Cst. The storage capacitor includes a gate insulating layer 58 and a passivation layer 70 between the first and second capacitor electrodes as a dielectric layer.

The gate insulating layer 58 is interposed between the gate line 52 and the data line 68 to prevent shortage and signal interference of the gate line 52 and the data line 68. For example, the gate insulating layer 58 may have a thickness of about 4000 Å. The passivation layer 70 is formed on the TFT T to protect the active layer 60 exposed between the source and drain electrodes 64 and 66. The passivation layer 70 further protects the source and drain electrodes 64 and 66. For example, the passivation layer 70 may have a thickness of about 2000 Å. Accordingly, the dielectric layer of the storage capacitor Cst may have a thickness of about 6000 Å. Since a capacitance of the storage capacitor Cst is inversely proportional to a thickness of the dielectric layer and is proportional to an area of the electrode, increase in the area of the electrode is required to obtain a higher capacitance at a given thickness of the dielectric layer. However, as the area of the electrode increases, aperture ratio and brightness of the IPS-LCD device decreases. In addition, a high resolution is not obtained in the IPS-LCD device.

SUMMARY

An in-plane switching mode liquid crystal display (IPS-LCD) device and a method of fabricating an IPS-LCD device to improve aperture ratio and resolution due to a storage capacitor in a reduced area.

According to one aspect, an array substrate for a liquid crystal display (LCD) device includes a gate line crossing a data line on a substrate to define a pixel region. A thin film transistor (TFT) includes a gate electrode connected to the gate line, an insulating layer on the gate electrode, an active layer on the insulating layer, a source electrode connected to the data line, and a drain electrode spaced apart from the source electrode. An auxiliary common electrode has a horizontal portion spaced from the gate electrode and is disposed in the pixel region. A metal layer overlaps the insulating layer and contacts the horizontal portion of the auxiliary common electrode through a first contact hole defined through the insulating layer. A passivation layer is disposed on the TFT and the metal layer. A pixel electrode has a horizontal portion overlapping the metal layer with the passivation layer therebetween to form a storage capacitor. The pixel electrode connects to the drain electrode through a second contact hole defined through the passivation layer.

According to another aspect, an array substrate for an LCD device includes a gate line crossing a data line on a substrate to define a pixel region. A gate electrode is connected to the gate line. An insulating layer is disposed on the gate electrode and an active layer on the insulating layer. A source electrode connects to the data line and a drain electrode is spaced apart from the source electrode, such that the source and drain electrodes overlap the active layer. An auxiliary common electrode has a horizontal portion spaced from the gate electrode and is disposed in the pixel region. A metal layer on the insulating layer may be of an island shape and positioned horizontally to substantially overlap the horizontal portion of the auxiliary common electrode. A passivation layer is disposed on the source and drain electrodes and the metal layer. A pixel electrode has a horizontal portion that overlaps the metal layer with the passivation layer therebetween to form a storage capacitor.

According to yet another aspect, a method of fabricating an array substrate for an LCD device includes forming a gate electrode on a substrate having a pixel region and a gate line connected to the gate electrode; forming an auxiliary common electrode having a horizontal portion spaced from the gate electrode and disposed in the pixel region; forming an insulating layer on the gate electrode, the gate line, and the auxiliary common electrode; forming an active layer and an ohmic contact pattern on the insulating layer and corresponding to the gate electrode; forming source and drain electrodes on the ohmic contact pattern and a metal layer on the insulating layer; forming a passivation layer over the source and drain electrodes and the metal layer; and forming a pixel electrode having a horizontal portion overlapping the metal layer with the passivation layer therebetween to form a storage capacitor.

BRIEF DESCRIPTION OF THE DRAWINGS

The accompanying drawings, which are included to provide a further understanding of the disclosure and are incorporated in and constitute a part of this specification, illustrate embodiments of the disclosure and are, therefore, not intended to be limiting to the spirit and scope of the principles taught through the illustrated embodiments.

DETAILED DESCRIPTION

Reference will now be made in detail to embodiments which are illustrated in the accompanying drawings. Wherever possible, similar reference numbers will be used to refer to the same or similar parts.

Figure 1:
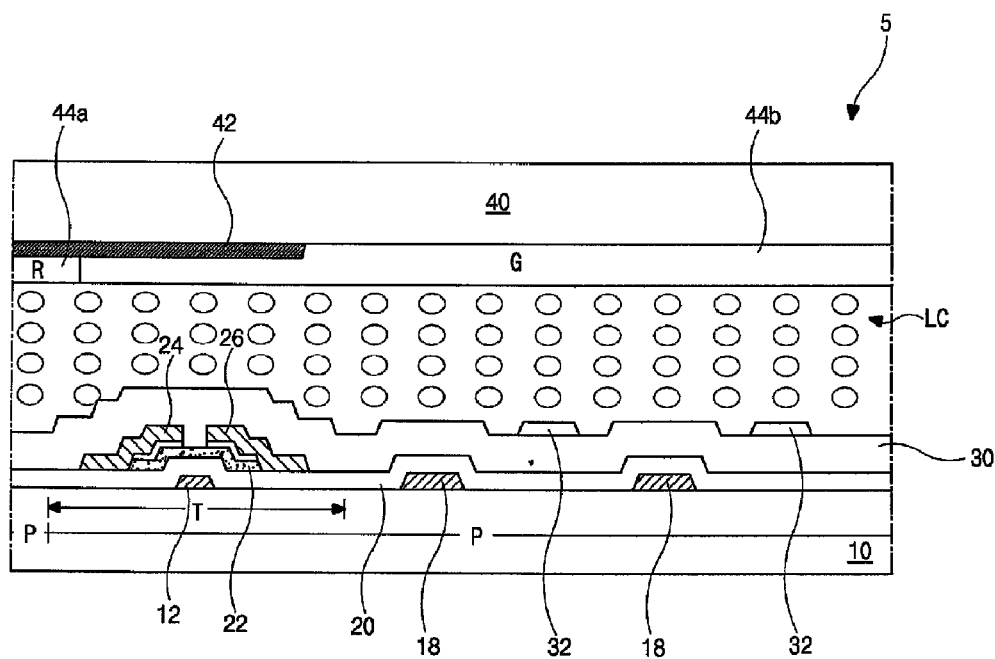
FIG. 1 is a cross-sectional view illustrating an in-plane switching mode liquid crystal display (IPS-LCD) device according to the related art.
Figure 2:
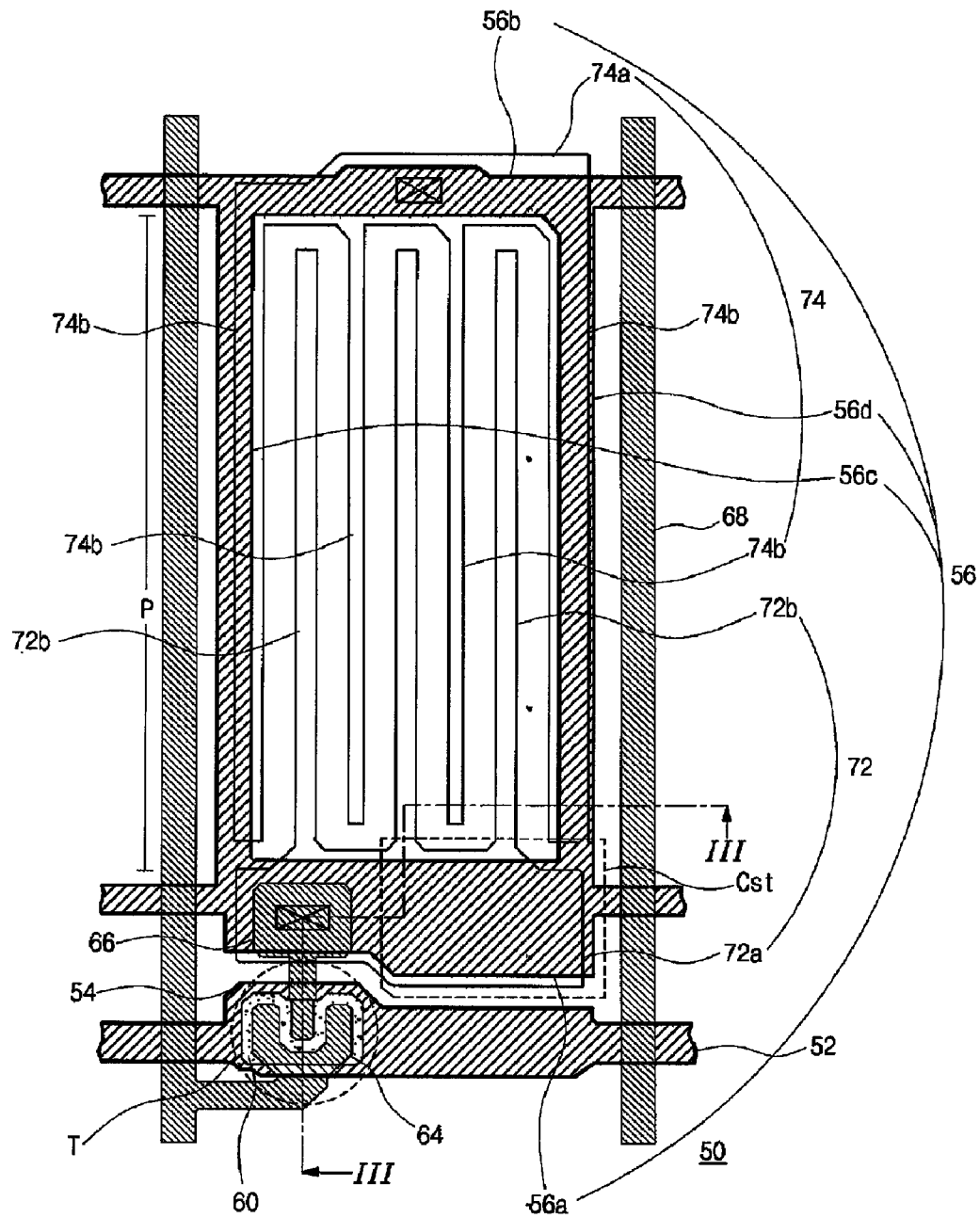
FIG. 2 is a schematic plan view of an array substrate for an IPS-LCD device according to the related art.
Figure 3:
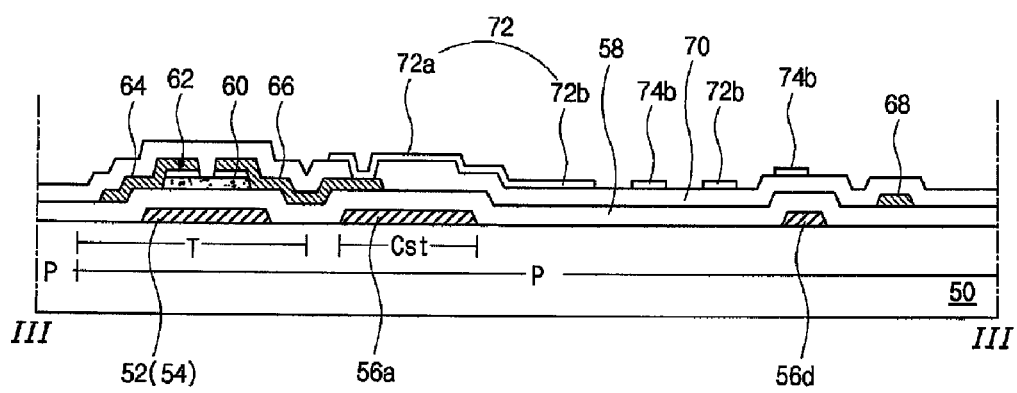
FIG. 3 is a schematic cross-sectional view taken along a line III-III of FIG. 2.
Figure 4:
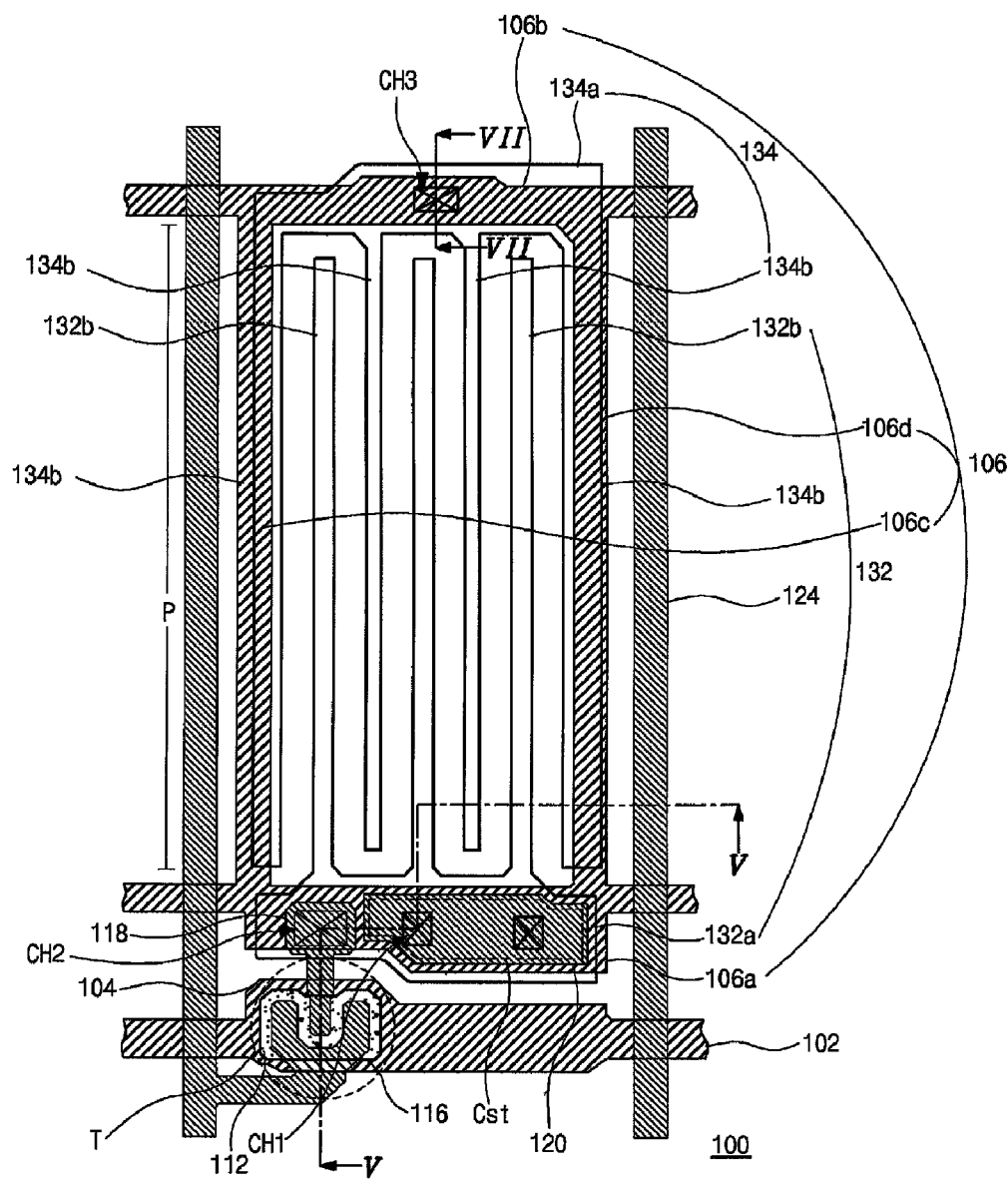
FIG. 4 is a schematic plan view showing an array substrate for an IPS-LCD device according to an embodiment of the present disclosure.

FIG. 4 is a schematic plan view showing an array substrate for an in-plane switching mode liquid crystal display (IPS-LCD) device according to an embodiment of the present disclosure.

In FIG. 4, a gate line 102 and a data line 124 are formed on a substrate 100. The gate line 102 crosses the data line 124 to define a pixel region P. A thin film transistor TFT T is connected to the gate line 102 and to the data line 124. The TFT T includes a gate electrode 104 connected to the gate line 102, an active layer 112 on the gate electrode 104, an ohmic contact layer (114 in FIG. 5) on the active layer 112, a source electrode 116 connected to the data line 124 and a drain electrode 118 spaced apart from the source electrode 116. The source and drain electrodes 116 and 118 contact the ohmic contact layer 114.

An auxiliary common electrode 106 is formed in the pixel region P. The auxiliary common electrode 106 has a rectangular ring shape including first and second horizontal portions 106a and 106b and first and second vertical portions 106c and 106d. The first and second horizontal portions 106a and 106b are respectively disposed at lower and upper portions of the pixel region P, with the lower portion being nearest the TFT T, and the first and second vertical portions 106c and 106d are disposed at left and right portions of the pixel region P, respectively, with the left portion being to the left of the TFT T. The first and second horizontal portions 106a and 106b are spaced apart from each other and parallel to the gate line 102. In addition, the first and second vertical portions 106c and 106d are spaced apart from each other and parallel to the data line 124. The auxiliary common electrode 106 may be formed of the same material and the same layer as the gate line 102.

A pixel electrode 132 and a common electrode 134 are formed in the pixel region P. The pixel electrode 132 and the common electrode 134 may be formed of a transparent conductive material. The pixel electrode 132 includes a horizontal portion 132a and a plurality of vertical portions 132b. The horizontal portion 132a of the pixel electrode 132 is formed over the first horizontal portion 106a of the auxiliary common electrode 106, and the plurality of vertical portions 132b of the pixel electrode 132 extend from the horizontal portion 132a of the pixel electrode 132. The horizontal portion 132a of the pixel electrode 132 is connected to the drain electrode 118 through a second contact hole CH2 in a passivation layer (not shown) to receive a data signal.

The common electrode 134 includes a horizontal portion 134a and a plurality of vertical portions 134b. The plurality of vertical portions 134b of the common electrode 134 extend from the horizontal portion 134a of the common electrode 134. The common electrode 134 contacts the auxiliary common electrode 106. The plurality of vertical portions 134b of the common electrode 134 alternate with the plurality of vertical portions 132b of the pixel electrode 132 in the pixel region P. The horizontal portion 134a of the common electrode 134 is connected to the second horizontal portion 106b of the auxiliary common electrode 106 through a third contact hole CH3 in the passivation layer (128 in FIG. 5) and a gate insulating layer (110 in FIG. 5) to receive a common voltage.

A metal layer 120 of an island shape is formed between the first horizontal portion 106a of the auxiliary common electrode 106 and the horizontal portion 132a of the pixel electrode 132. The metal layer 120 contacts the auxiliary common electrode 106 through a first contact hole CH1 in the gate insulating layer and overlaps the horizontal portion 132a of the pixel electrode 132 to constitute a storage capacitor Cst with the passivation layer therebetween. Accordingly, the storage capacitor Cst includes the metal layer 120 as a first capacitor electrode, the horizontal portion 132a of the pixel electrode 132 as a second capacitor electrode and the passivation layer 128 as a dielectric layer.

Figure 5:
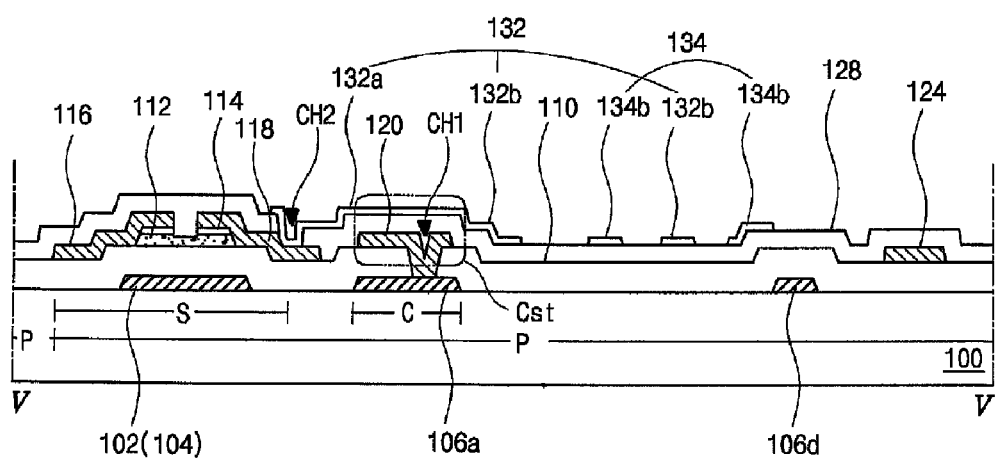
FIG. 5 is a schematic cross-sectional view taken along a line V-V of FIG. 4.*d*
Figure 7:
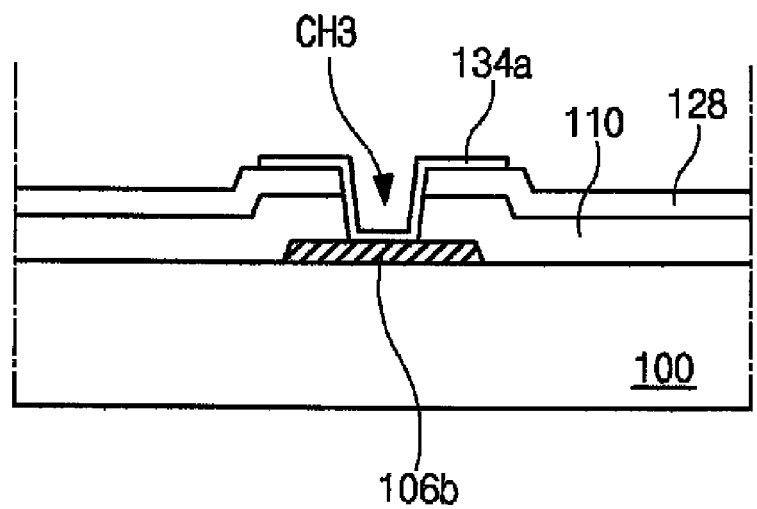
FIG. 7 is a schematic cross-sectional view taken along a line VII-Vii of FIG. 4.

FIG. 5 is a schematic cross-sectional view taken along a line V-V of FIG. 4, and FIG. 7 is a schematic cross-sectional view taken along a line VII-VII of FIG. 4.

In FIGS. 5 and 7, a pixel region P having a switching area S and a storage area C is defined in a substrate 100. A TFT T is formed in the switching area S of the substrate 100. The TFT T includes a gate electrode 104, a gate insulating layer 110, an active layer 112, an ohmic contact layer 114, a source electrode 116 and a drain electrode 118. An auxiliary common electrode 106 including first and second horizontal portions 106a and 106b (of FIG. 4) and first and second vertical portions 106c (of FIG. 4) and 106d are formed in the pixel region P on the substrate 100, and the gate insulating layer 110 is formed on the auxiliary common electrode 106. The gate insulating layer 110 has a first contact hole CH1 exposing the first horizontal portion 106a of the auxiliary common electrode 106. A metal layer 120 is formed on the gate insulating layer 110 and connected to the first horizontal portion 106a of the auxiliary common electrode 106 through the first contact hole CH1.

A passivation layer 128 is formed on the TFT T and the metal layer 120. The passivation layer 128 has a second contact hole CH2 exposing the drain electrode 118. A pixel electrode 132, including a horizontal portion 132a and a plurality of vertical portions 132b, and a common electrode 134 including a horizontal portion 134a (of FIG. 4) and a plurality of vertical portions 134b are formed on the passivation layer 128. The pixel electrode 132 and the common electrode 134 include a transparent conductive material. The plurality of vertical portions 132b of the pixel electrode 132 and the plurality of vertical portions 134b of the common electrode 134 are alternately disposed in the pixel region P.

The horizontal portion 132a of the pixel electrode 132 is connected to the drain electrode 118 through the second contact hole CH2. In addition, the horizontal portion 132a of the pixel electrode 132 overlaps the metal layer 120 to constitute a storage capacitor Cst in the storage area C with the passivation layer 128 interposed therebetween. Since the passivation layer 128 having a thickness of about 2000 Å may be used as a dielectric layer, a capacitance of the storage capacitor Cst increases. Accordingly, the storage capacitor Cst can be formed to have a reduced area for a given capacitance and aperture ratio is improved. Note that the thickness of the passivation layer 128, and thus of the dielectric, may be further decreased to raise capacitance by thickening the metal layer 120 when the passivation layer 128 is formed of an insulating material having planarization property such as an organic material.

FIGS. 6A to 6E are schematic cross-sectional views showing a method of fabricating an array substrate for an IPS-LCD device according to an embodiment of the present disclosure. FIGS. 6A to 6E are taken along a line V-V of FIG. 4.

Figure 6A:
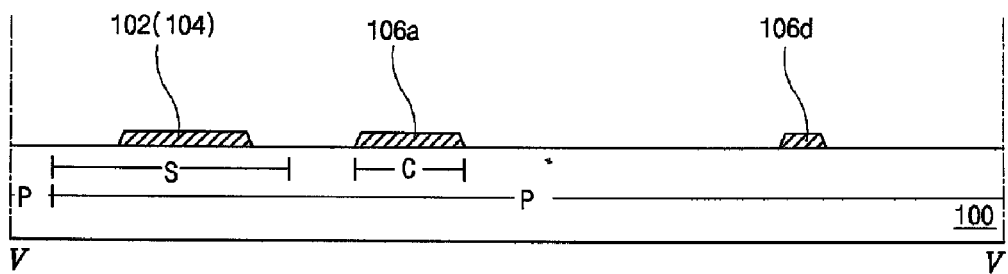
FIGS. 6A to 6E are schematic cross-sectional views showing a method of fabricating an array substrate for an IPS-LCD device according to an embodiment of the present disclosure.

In FIG. 6A, a substrate 100 having a pixel region P includes a gate line 102, a gate electrode 104 connected to the gate line 102 and an auxiliary common electrode 106 including first and second horizontal portions 106a and 106b (of FIG. 4) and first and second vertical portions 106c (of FIG. 4) and 106d. These are formed by depositing and patterning a conductive metallic material such as aluminum (Al), aluminum (Al) alloy, chromium (Cr), molybdenum (Mo), tungsten (W), titanium (Ti), copper (Cu), copper (Cu) alloy and tantalum (Ta). The pixel region P has a switching area S and a storage area C. A portion of the gate line 102 is used as the gate electrode 104. Alternately, the gate electrode 104 may be protruded from the gate line 102. The first horizontal portion 106a of the auxiliary common electrode 106 is disposed in the storage area C.

Figure 6B:
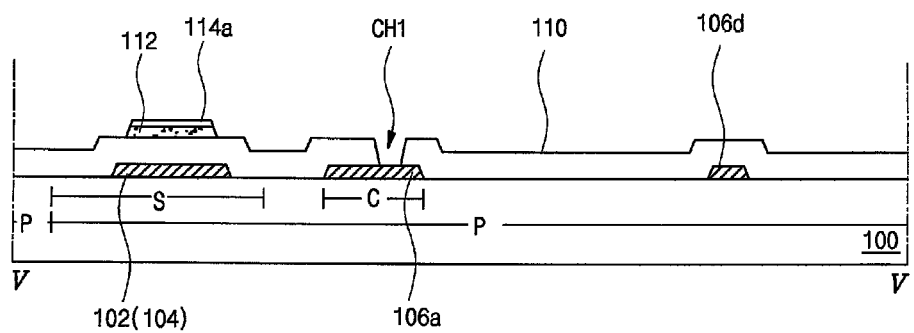

In FIG. 6B, a gate insulating layer 110 is formed on the gate line 102, the gate electrode 104 and the auxiliary common electrode 106 by depositing and patterning an inorganic insulating material such as silicon nitride (SiNx) and silicon oxide (SiO$_2$). The gate insulating layer 110 has a first contact hole CH1 exposing the first horizontal portion 106a of the auxiliary common electrode 106. After an intrinsic amorphous silicon (a-Si:H) layer (not shown) and an impurity-doped amorphous silicon (n+a-Si:H) layer are sequentially formed on the gate insulating layer 110, the intrinsic amorphous silicon (a-Si:H) layer and the impurity-doped amorphous silicon (n+a-Si:H) layer are patterned to form an active layer 112 of intrinsic amorphous silicon (a-Si:H) on the gate insulating layer 110. The active layer 112 is patterned over the gate electrode 104 and an ohmic contact pattern 114a of impurity-doped amorphous silicon (n+a-Si:H) is patterned on the active layer 112.

In another embodiment, the gate insulating layer 110 may be patterned to form the first contact hole CH1 after the active layer 112 and the ohmic contact pattern 114a are formed. Further, in the other embodiment, the first contact hole CH1, active layer 112 and the ohmic contact pattern 114a may be formed through a single mask step using a mask having a transmissive area, a blocking area and a half-transmissive area. For example, a transmittance of the half-transmissive area may be greater than a transmittance of the blocking area and smaller than a transmittance of the transmissive area.

Figure 6C:
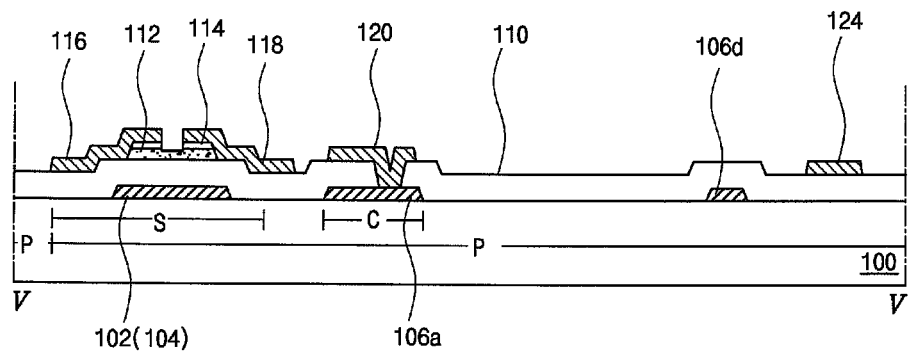

In FIG. 6C, source and drain electrodes 116 and 118 are formed on the ohmic contact pattern 114a by depositing and patterning a conductive metallic material such as aluminum (Al), aluminum (Al) alloy, chromium (Cr), molybdenum (Mo), tungsten (W), titanium (Ti), copper (Cu), copper (Cu) alloy and tantalum (Ta). The source and drain electrodes 116 and 118 are spaced apart from each other. At the same time, a metal layer 120 having an island shape is formed on the gate insulating layer 110 over the first horizontal portion 106a of the auxiliary common electrode 106. The metal layer 120 is connected to the first horizontal portion 106a of the auxiliary common electrode 106 through the first contact hole CH1. Although not shown in FIG. 6C, a data line 124 (of FIG. 4) formed on the gate insulating layer 110 is connected to the source electrode 116. The ohmic contact pattern 114a is patterned using the source and drain electrodes 116 and 118 as an etch mask to form an ohmic contact layer 114.

Figure 6D:
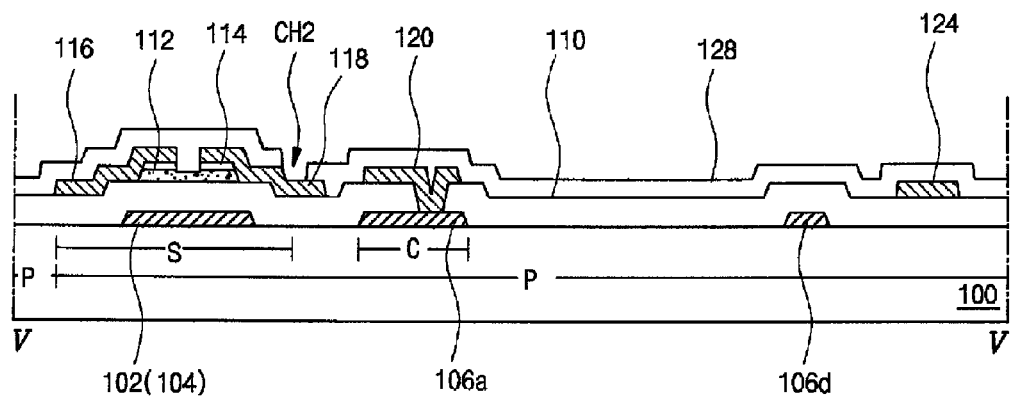

In FIG. 6D, a passivation layer 128 is formed on the source electrode 116, the drain electrode 118 and the metal layer 120 by depositing and patterning one of an inorganic insulating material such as silicon nitride (SiNx) and silicon oxide (SiO$_2$) and an organic insulating material such as benzocyclobutene (BCB) and acrylic resin. The passivation layer 128 has a second contact hole CH2 exposing the drain electrode 118. In addition, the passivation layer 128 and the gate insulating layer 110 have a third contact hole CH3 (of FIG. 7) exposing the second horizontal portion 106b of the auxiliary common electrode 106.

Figure 6E:
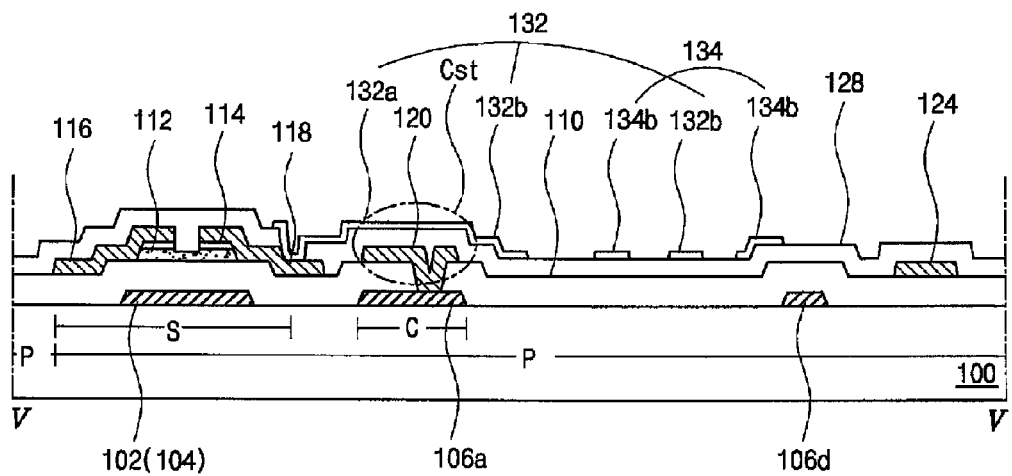

In FIG. 6E, a pixel electrode 132 and a common electrode 134 are formed on the passivation layer in the pixel region P by depositing and patterning a transparent conductive material such as indium-tin-oxide (ITO) and indium-zinc-oxide (IZO). The pixel electrode 132 includes a horizontal portion 132a and a plurality of vertical portions 132b extending from the horizontal portion 132a, and the common electrode 134 includes a horizontal portion 134a (FIG. 4) and a plurality of vertical portions 134b extending from the horizontal portion 134a. The plurality of vertical portions 132b of the pixel electrode 132 alternate with, and are spaced apart from, the plurality of vertical portions 134b of the common electrode 134 in the pixel region P. The horizontal portion 132a of the pixel electrode 132 is connected to the drain electrode 118 through the second contact hole CH2. In addition, the horizontal portion 134a of the common electrode 134 is connected to the second portion 106b of the auxiliary common electrode 106 through the third contact hole.

In the storage area C, the metal layer 120 connected to the first horizontal portion 106a of the auxiliary common electrode 106, the passivation layer 128 and the horizontal portion 132a of the pixel electrode 132 constitute a storage capacitor Cst.

Consequently, in an array substrate for an IPS-LCD device of the present disclosure, a storage capacitor is formed by using a passivation layer as a dielectric layer having a reduced thickness. Accordingly, aperture ratio is enlarged. Moreover, brightness is improved and an IPS-LCD device having high resolution is obtained.

It will be apparent to those skilled in the art that various modifications and variations can be made in a driving circuit for a liquid crystal display device and a method of driving the same of the present disclosure without departing from the spirit or scope of the disclosure. Thus, it is intended that the present disclosure cover the modifications and variations of this disclosure provided they come within the scope of the appended claims and their equivalents.

What is claimed is:

1. An array substrate for a liquid crystal display (LCD) device, comprising:
    a gate line crossing a data line on a substrate to define a pixel region;
    a thin film transistor (TFT) including a gate electrode connected to the gate line, an insulating layer directly on the gate electrode, an active layer on the insulating layer, a source electrode connected to the data line and a drain electrode spaced apart from the source electrode;
    an auxiliary common electrode having a horizontal portion spaced from the gate electrode and disposed in the pixel region, the auxiliary common electrode having a first horizontal portion disposed adjacent to and parallel to the gate line in a plan view, wherein the insulating layer is formed directly on the auxiliary common electrode;
    a metal layer that overlaps the insulating layer and contacts the horizontal portion of the auxiliary common electrode through a first contact hole defined through the insulating layer, wherein the metal layer is formed directly on the insulating layer;
    a passivation layer disposed on the TFT and the metal layer, wherein the passivation layer covers the source and drain electrodes; and
    a pixel electrode having a horizontal portion overlapping the metal layer with the passivation layer therebetween to form a storage capacitor, the horizontal portion of the pixel electrode disposed parallel to the gate line in the plan view and overlapping the first horizontal portion of the auxiliary common electrode, the metal layer overlapping and disposed between the first horizontal portion of the auxiliary common electrode and the horizontal portion of the pixel electrode and not extending outside the first horizontal portion of the auxiliary common electrode and the horizontal portion of the pixel electrode, the metal layer with the passivation layer there between to form a storage capacitor, the pixel electrode connected to the drain electrode through a second contact hole defined through the passivation layer,
    wherein the storage capacitor includes a first capacitor electrode having the metal layer that is formed of the same layer as the source and drain electrodes and is connected to the auxiliary common electrode formed of the same layer as the gate line and a second capacitor electrode having the pixel electrode across the passivation layer.

2. The substrate of claim 1, wherein the metal layer comprises a top flat portion having a horizontal position near to that of the horizontal portion of the auxiliary common electrode to define a storage area.

3. The substrate of claim 1, wherein the horizontal portion of the auxiliary common electrode comprises a first horizontal portion, the auxiliary common electrode comprising a second horizontal portion and first and second vertical portions, wherein the first and second horizontal portions are respectively disposed at lower and upper portions of the pixel region, with the lower portion being nearest to the TFT, and the first and second vertical portions are respectively disposed at left and right portions of the pixel region.

4. The substrate of claim 3, wherein the auxiliary common electrode comprises a conductive metallic material.

5. The substrate of claim 1, wherein the pixel electrode further comprises a plurality of vertical portions extending from the horizontal portion, further comprising:
    a common electrode having a horizontal portion and a plurality of vertical portions extending from the horizontal portion and alternating with the plurality of vertical portions of the pixel electrode within the pixel region.

6. The substrate of claim 5, wherein at least one of the common electrode and the pixel electrode comprise a transparent conductive material.

7. An array substrate for a liquid crystal display (LCD) device, comprising:
   a gate line crossing a data line on a substrate to define a pixel region;
   a gate electrode connected to the gate line, an insulating layer directly on the gate electrode, an active layer on the insulating layer, a source electrode connected to the data line and a drain electrode spaced apart from the source electrode, wherein the source and drain electrodes overlap the active layer;
   an auxiliary common electrode having a horizontal portion spaced from the gate electrode and disposed in the pixel region, the auxiliary common electrode having a first horizontal portion disposed adjacent to and parallel to the gate line in a plan view, wherein the insulating layer is formed directly on the auxiliary common electrode;
   a metal layer directly on the insulating layer that comprises a flat top portion positioned horizontally to substantially overlap the horizontal portion of the auxiliary common electrode;
   a passivation layer on the source and drain electrodes and the metal layer; and
   a pixel electrode having a horizontal portion that overlaps the metal layer with the passivation layer therebetween to form a storage capacitor, the horizontal portion of the pixel electrode disposed parallel to the gate line in the plan view, the metal layer overlapping and disposed between the first horizontal portion of the auxiliary common electrode and the horizontal portion of the pixel electrode and not extending outside the first horizontal portion of the auxiliary common electrode and the horizontal portion of the pixel electrode,
   wherein the storage capacitor includes a first capacitor electrode having the metal layer that is formed of the same layer as the source and drain electrodes and is connected to the auxiliary common electrode formed of the same layer as the gate line and a second capacitor electrode having the pixel electrode across the passivation layer.

8. The substrate of claim 7, further comprising:
   a first contact hole defined through the insulating layer through which the metal layer contacts the horizontal portion of the auxiliary common electrode; and
   a second contact hole defined through the passivation layer through which the pixel electrode is connected to the drain electrode.

9. The substrate of claim 7, wherein the pixel electrode further comprises a plurality of vertical portions extending from the horizontal portion, further comprising:
   a common electrode having a horizontal portion and a plurality of vertical portions extending from the horizontal portion that alternate with the plurality of vertical portions of the pixel electrode within the pixel region, wherein the alternating plurality of vertical portions of the pixel and common electrodes are mutually spaced apart.

10. The substrate of claim 9, wherein the horizontal portion of the auxiliary common electrode comprises first and second horizontal portions respectively disposed at lower and upper portions of the pixel region, with the lower portion being nearest the gate electrode, further comprising:
    a contact hole defined through the insulating and passivation layers to connect the second horizontal portion of the auxiliary common electrode with the horizontal portion of the common electrode.

11. The substrate of claim 7, further comprising:
    an ohmic contact layer on the active layer over which the source and drain electrodes are disposed.

* * * * *